(12) United States Patent
Kawadahara (10) Patent No.: US 11,275,310 B2
(45) Date of Patent: Mar. 15, 2022

(54) SEMICONDUCTOR MANUFACTURING APPARATUS AND METHOD OF MANUFACTURING SEMICONDUCTOR DEVICE

(71) Applicant: Kioxia Corporation, Tokyo (JP)

(72) Inventor: Sho Kawadahara, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/115,871

(22) Filed: Dec. 9, 2020

(65) Prior Publication Data

US 2021/0278770 A1 Sep. 9, 2021

(30) Foreign Application Priority Data

Mar. 3, 2020 (JP) .............................. JP2020-036060

(51) Int. Cl.
*G03F 7/20* (2006.01)
*H01L 21/027* (2006.01)

(52) U.S. Cl.
CPC ...... *G03F 7/70058* (2013.01); *H01L 21/0274* (2013.01)

(58) Field of Classification Search
CPC ............. G03F 7/70558; G03F 7/70191; G03F 7/70058; H10L 21/0274
USPC .............................................. 355/53, 67–71
See application file for complete search history.

(56) References Cited

U.S. PATENT DOCUMENTS

| | | | |
|---|---|---|---|
| 5,591,958 A * | 1/1997 | Nishi | G03F 7/70066 250/201.1 |
| 6,411,368 B1 * | 6/2002 | Matsumoto | G03F 7/70108 355/67 |
| 6,476,905 B1 * | 11/2002 | Li | G03B 27/72 355/53 |
| 7,196,774 B2 * | 3/2007 | Won | G03F 7/70191 355/71 |
| 7,518,705 B2 | 4/2009 | Verweij et al. | |
| 10,712,668 B2 * | 7/2020 | Chen | H01L 21/00 |

FOREIGN PATENT DOCUMENTS

| | | |
|---|---|---|
| JP | 62-124845 | 8/1987 |
| JP | 4741560 B2 | 8/2011 |
| JP | 6012200 B2 | 10/2016 |

* cited by examiner

*Primary Examiner* — Hung Nguyen
(74) *Attorney, Agent, or Firm* — Oblon, McClelland, Maier & Neustadt, L.L.P.

(57) ABSTRACT

In one embodiment, a semiconductor manufacturing apparatus includes a stage on which a substrate is to be installed. The apparatus further includes a light source configured to generate light. The apparatus further includes a shaper including a rotating portion provided with an opening configured to shape the light from the light source, the shaper being configured to irradiate a photomask with the light which has passed through the opening. The apparatus further includes a controller configured to change a width of the light passing through the opening by rotating the rotating portion while scanning the substrate by the light which has passed through the photomask.

16 Claims, 8 Drawing Sheets

SEMICONDUCTOR MANUFACTURING APPARATUS AND METHOD OF MANUFACTURING SEMICONDUCTOR DEVICE

CROSS REFERENCE TO RELATED APPLICATION

This application is based upon and claims the benefit of priority from the prior Japanese Patent Application No. 2020-036060, filed on Mar. 3, 2020, the entire contents of which are incorporated herein by reference.

FIELD

Embodiments described herein relate to a semiconductor manufacturing apparatus and a method of manufacturing a semiconductor device.

BACKGROUND

When a resist film on a substrate is exposed, it is a problem that process accuracy of the resist film becomes poor in a case where accuracy of synchronizing operations of a masking blade, a reticle, the substrate and the like is poor.

BRIEF DESCRIPTION OF THE DRAWINGS

FIGS. 2A to 4B are diagrams illustrating an operation of the semiconductor manufacturing apparatus of the first embodiment;

DETAILED DESCRIPTION

Embodiments will now be explained with reference to the accompanying drawings. In FIGS. 1A to 8C, same signs are attached to same configurations and redundant description is omitted.

In one embodiment, a semiconductor manufacturing apparatus includes a stage on which a substrate is to be installed. The apparatus further includes a light source configured to generate light. The apparatus further includes a shaper including a rotating portion provided with an opening configured to shape the light from the light source, the shaper being configured to irradiate a photomask with the light which has passed through the opening. The apparatus further includes a controller configured to change a width of the light passing through the opening by rotating the rotating portion while scanning the substrate by the light which has passed through the photomask.

First Embodiment

Figure 1A:
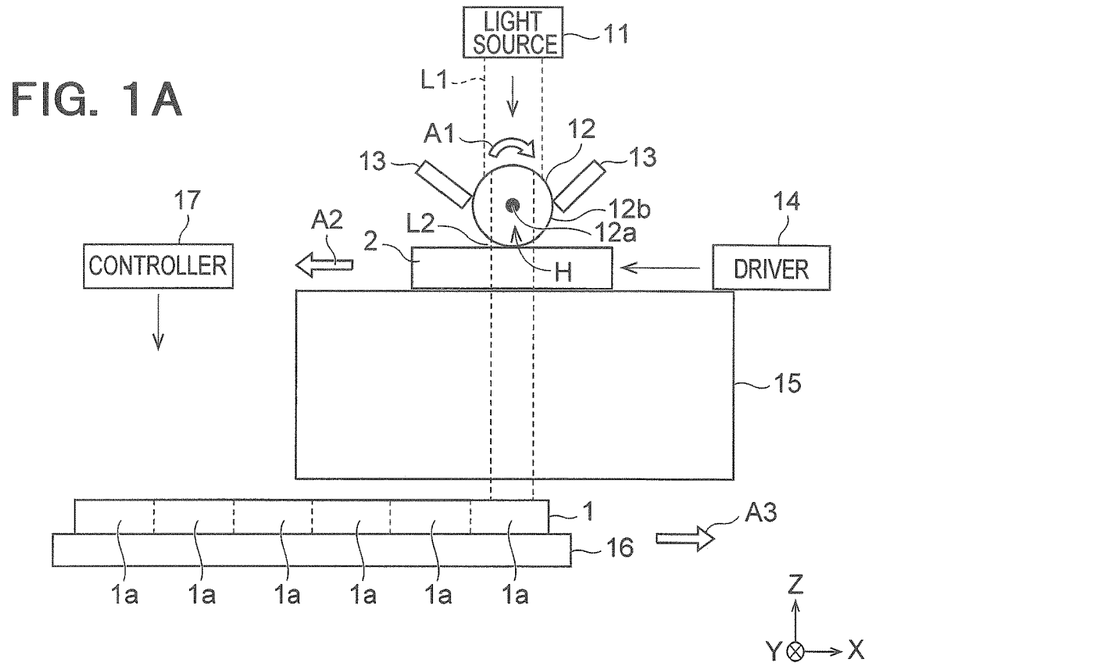
FIGS. 1A to 1C are diagrams illustrating a structure of a semiconductor manufacturing apparatus of a first embodiment.
Figure 1B:
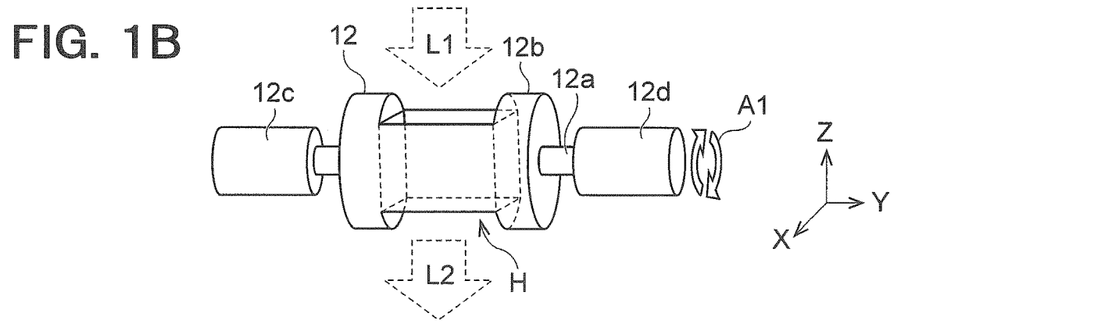
Figure 1C:
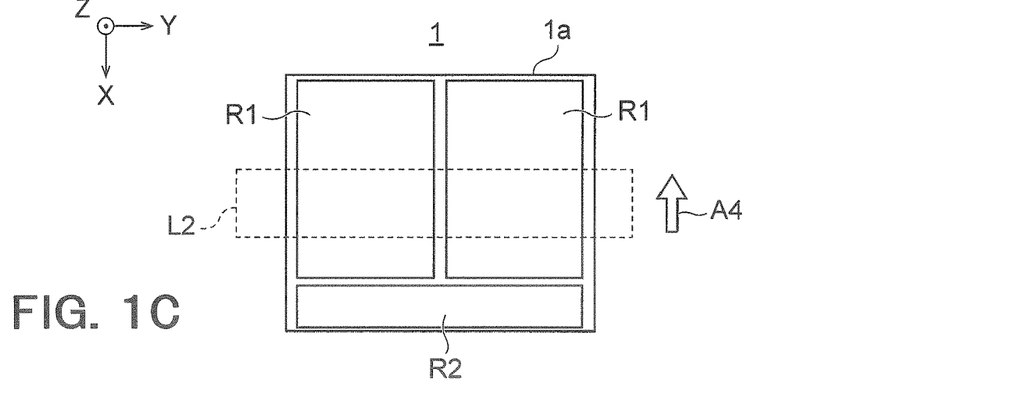

FIGS. 1A to 1C are diagrams illustrating a structure of a semiconductor manufacturing apparatus of the first embodiment.

FIG. 1A is a sectional view illustrating the semiconductor manufacturing apparatus. The semiconductor manufacturing apparatus of the present embodiment is an exposing device, and includes a light source 11, a masking device 12 which is an example of a shaper, a plurality of masking members 13, a driver 14, a projecting optical system 15, a stage 16, and a controller 17.

FIG. 1A illustrates an X direction and a Y direction which are parallel to an installation surface of the semiconductor manufacturing apparatus and are vertical to each other, and a Z direction which is vertical to the installation surface of the semiconductor manufacturing apparatus. In the present description, a +Z direction is handled as an upper direction and a −Z direction is handled as a lower direction. The −Z direction may coincide with a gravity direction and may not coincide with the gravity direction.

FIG. 1A further illustrates a wafer 1 which is an example of a substrate, and a reticle 2 which is an example of a photomask. The wafer 1 includes a plurality of chip areas 1a for manufacturing a plurality of chips. The wafer 1 includes, for example, a semiconductor wafer (semiconductor substrate) such as a silicon wafer (silicon substrate), a process target film which is formed on the semiconductor wafer, and a resist film formed on the process target film. The reticle 2 includes a pattern for patterning the resist film. The semiconductor manufacturing apparatus of the present embodiment exposes the resist film by irradiating the resist film with light which has passed through the reticle 2. In the present embodiment, by developing the exposed resist film, the resist film can be patterned. The patterned resist film is used as a resist mask for processing the process target film.

FIG. 1B is a perspective view illustrating the masking device 12. The masking device 12 includes a shaft 12a, a rotary blade 12b which is an example of a rotating portion, a bearing 12c, and a motor 12d. The rotary blade 12b includes a slit H which is an example of an opening.

FIG. 1C is a plan view illustrating the wafer 1. Each chip area 1a of the wafer 1 includes, for example, a plurality of memory cell array areas R1 and a peripheral circuit area R2. Each chip of the present embodiment is a memory chip including a three-dimensional memory.

Hereinafter, with reference to FIG. 1A, the structure of the semiconductor manufacturing apparatus of the present embodiment will be described. In the description, FIG. 1B and FIG. 1C will be also appropriately referred to.

The light source 11 generates light to be radiated to the wafer 1. Examples of the light source 11 are a g-ray light source (wavelength: 436 nm), an h-ray light source (wavelength: 405 nm), an i-ray light source (wavelength: 365 nm), a KrF-ray light source (wavelength: 248 nm), an ArF-ray light source (wavelength: 193 nm), an F2-ray light source (wavelength: 157 nm), an EUV light source (wavelength: 13.5 nm) and the like. A sign L1 denotes the light generated from the light source 11.

The masking device 12 shapes the light from the light source 11, and specifically changes a width of the light from the light source 11. A sign L2 denotes the light shaped by passing through the slit H of the masking device 12. As a result of shaping, the width in the X direction of the light L2 is shorter than the width in the X direction of the light L1. The light which has passed through the slit H is radiated to the reticle 2.

The masking device 12 includes, as described above, the shaft 12a, the rotary blade 12b, the bearing 12c, and the motor 12d (FIG. 1B). The shaft 12a is attached to the rotary blade 12b, and can rotate the rotary blade 12b as illustrated by an arrow A1. The shaft 12a of the present embodiment is provided in parallel to the Y direction, and can rotate the rotary blade 12b about a straight line (rotary axis) parallel to the Y direction. The bearing 12c is provided on an end in the −Y direction of the shaft 12a. The motor 12d is provided on the end in the +Y direction of the shaft 12a, and can rotate the rotary blade 12b by rotating the shaft 12a. The motor 12d of the present embodiment is a stepping motor.

As illustrated in FIG. 1A, the rotary blade 12b has a circular sectional shape on a section vertical to the rotary axis of the rotary blade 12b. In FIG. 1A, the rotary axis of the rotary blade 12b extends in the Y direction, and the section vertical to the rotary axis of the rotary blade 12b is an XZ section. The rotary blade 12b of the present embodiment is a rotary drum having a roughly cylindrical shape. The rotary blade 12b is formed of a material which shields the light from the light source 11. Therefore, the light made incident on the rotary blade 12b from the light source 11 is shielded by the rotary blade 12b and passes through the slit H. The material of the rotary blade 12b may be a metal or a nonmetal such as a resin or ceramics. Since the examples described above are the examples of the light source 11, it is desirable that the rotary blade 12b is formed of the material which shields the light having the wavelength of 13.5 nm to 456 nm.

As illustrated in FIG. 1B, the slit H has a quadrangular sectional shape on the section vertical to the direction in which the slit H penetrates the rotary blade 12b. In FIG. 1B, the slit H penetrates the rotary blade 12b in the Z direction, and the section vertical to the direction is an XY section. The slit H of the present embodiment has a roughly rectangular parallelepiped shape, and the XY sectional shape of the slit H illustrated in FIG. 1B is a square or a rectangle. Therefore, the semiconductor manufacturing apparatus of the present embodiment can change the width in the X direction of the light L2 by rotating the rotary blade 12b and rotating the slit H. Details of the width change of the light L2 will be described later with reference to FIGS. 2A to 4B.

Each masking member 13 is arranged near the rotary blade 12b. FIG. 1A illustrates the two masking members 13 arranged on a right side and a left side of the rotary blade 12b. The masking member 13 is formed of the material which shields the light from the light source 11, similarly to the rotary blade 12b. Accordingly, excess light such as the light not made incident on the rotary blade 12b can be shielded by the masking members 13. It is desirable that the masking members 13 are formed of the material which shields the light having the wavelength of 13.5 nm to 456 nm.

The driver 14 is provided to hold and drive the reticle 2. The driver 14 of the present embodiment can move the reticle 2 within an XY plane as illustrated by an arrow A2. Accordingly, a position where the light L2 is made incident on the reticle 2 can be changed and the light L2 can be shaped into a desired shape. The driver 14 of the present embodiment can move the reticle 2 in ±X directions and ±Y directions. The light which has passed through the reticle 2 is made incident on the projecting optical system 15.

The projecting optical system 15 is provided in order to project the light which has passed through the reticle 2 onto the wafer 1. The projecting optical system 15 includes an optical element such as a lens, for example.

The stage 16 is provided in order to install the wafer 1. The wafer 1 is installed on an upper surface of the stage 16 in such a state that the resist film is turned upwards. In FIG. 1A, a certain chip area 1a in the wafer 1 is irradiated with the light L2 from the projecting optical system 15. The stage 16 of the present embodiment can move within the XY plane together with the wafer 1 as illustrated by an arrow A3. Accordingly, the position where the wafer 1 is irradiated with the light L2 can be changed and the wafer 1 can be scanned by the light L2. In FIG. 1C, by the stage 16 moving as the arrow A3, the wafer 1 is scanned as an arrow A4. The stage 16 of the present embodiment can move the wafer 1 in the ±X directions and the ±Y directions.

The controller 17 controls operations of the semiconductor manufacturing apparatus. Examples of the controller 17 are a processor, an electric circuit, a PC (Personal Computer) and the like. The controller 17 can control, for example, a light emitting operation of the light source 11, a rotating operation of the motor 12d, the operation of the driver 14, and the operation of the stage 16 or the like. The controller 17 can rotate the rotary blade 12b by controlling the motor 12d, move the reticle 2 by controlling the driver 14, and scan the wafer 1 by the light L2 by controlling the stage 16.

The controller 17 of the present embodiment can synchronize the operations of the rotary blade 12b, the reticle 2 and the wafer 1 by the control. The controller 17 can rotate the rotary blade 12b while scanning the wafer 1 by the light L2, for example. Accordingly, the width of the light L2 can be changed to a suitable width according to the position where the wafer 1 is irradiated with the light L2. The controller 17 can further move the reticle 2 while scanning the wafer 1 by the light L2. Therefore, the shape of the light L2 can be changed while scanning the wafer 1. In this way, the controller of the present embodiment can change the width and shape of the light L2 in real time while scanning the wafer 1.

The controller 17 of the present embodiment rotates the rotary blade 12b based on information regarding a pattern that is to be formed on the wafer 1. For example, the width of the light L2 is set narrow when scanning an area where a fine pattern is to be formed, and the width of the light L2 is set wide when scanning the other areas. Examples of the above-described information are the information regarding the shape of the pattern, and a magnification component of a memory cell calculated from a wafer shape measuring device, an electron microscope, an alignment inspecting device and the like. The controller 17 of the present embodiment determines the width of the light L2 based on such information, and determines a rotating angle of the rotary blade 12b so as to achieve the width. The controller 17 of the preset embodiment further determines a scanning speed of scanning the wafer 1 based on such information. The controller 17 may change the width of the light L2 according to the scanning speed of the wafer 1.

In the present embodiment, after the wafer 1 is installed on the stage 16, the light is generated from the light source 11. The light generated from the light source 11 is radiated to the wafer 1 through the slit H, the reticle 2 and the projecting optical system 15. At the time, the controller 17 scans the wafer 1 by the light by moving the stage 16. Accordingly, the resist film included in the wafer 1 can be exposed. The controller 17 further rotates the rotary blade 12b while scanning the wafer 1 by the light. Therefore, the width of the light can be changed to the suitable width according to the position where the wafer 1 is irradiated with the light.

The width of the light can be changed by making the light pass through a clearance between two members. However, in this case, it is needed to move the two members in order to change the width of the light, and when accuracy of synchronizing the operations of the members is poor, process accuracy of the resist film becomes poor. On the other hand, the width of the light of the present embodiment can be changed by rotating the rotary blade 12b. Therefore, the width of the light can be changed without synchronizing the operations of the plurality of members, and exposure accuracy can be easily improved.

FIGS. 2A to 4B are diagrams illustrating the operation of the semiconductor manufacturing apparatus of the first embodiment.

Figure 2A:
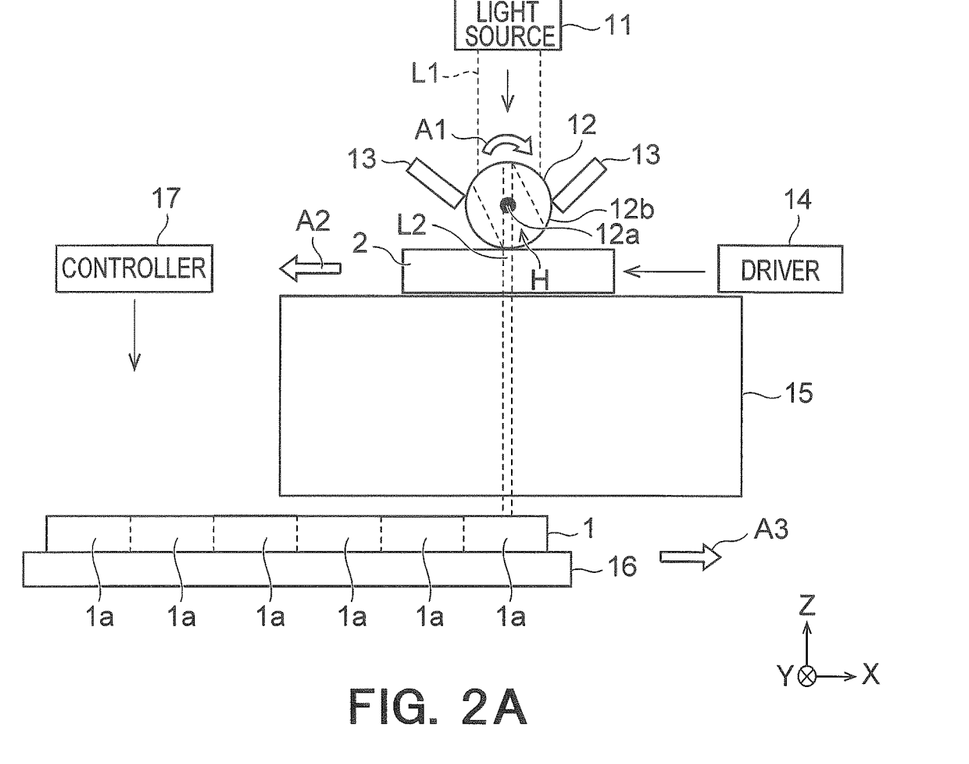
Figure 2B:
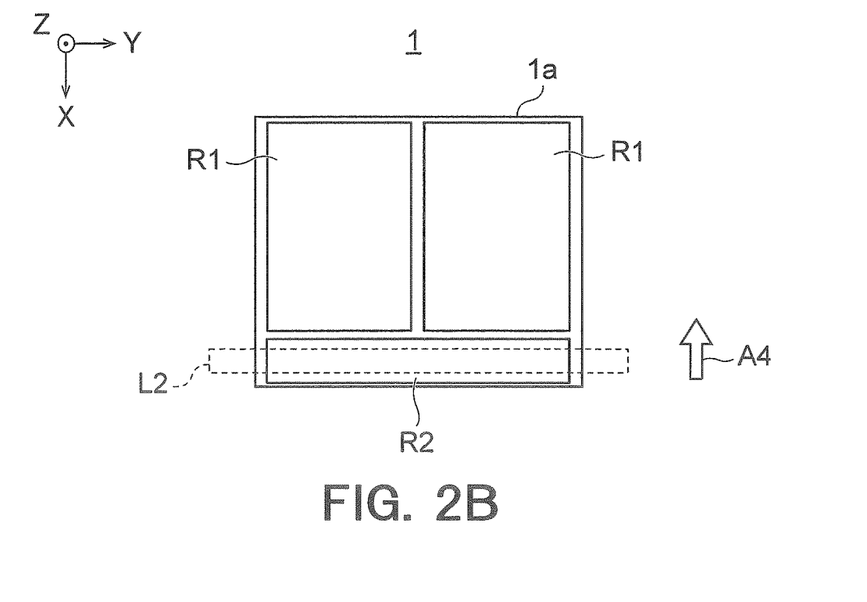
Figure 3A:
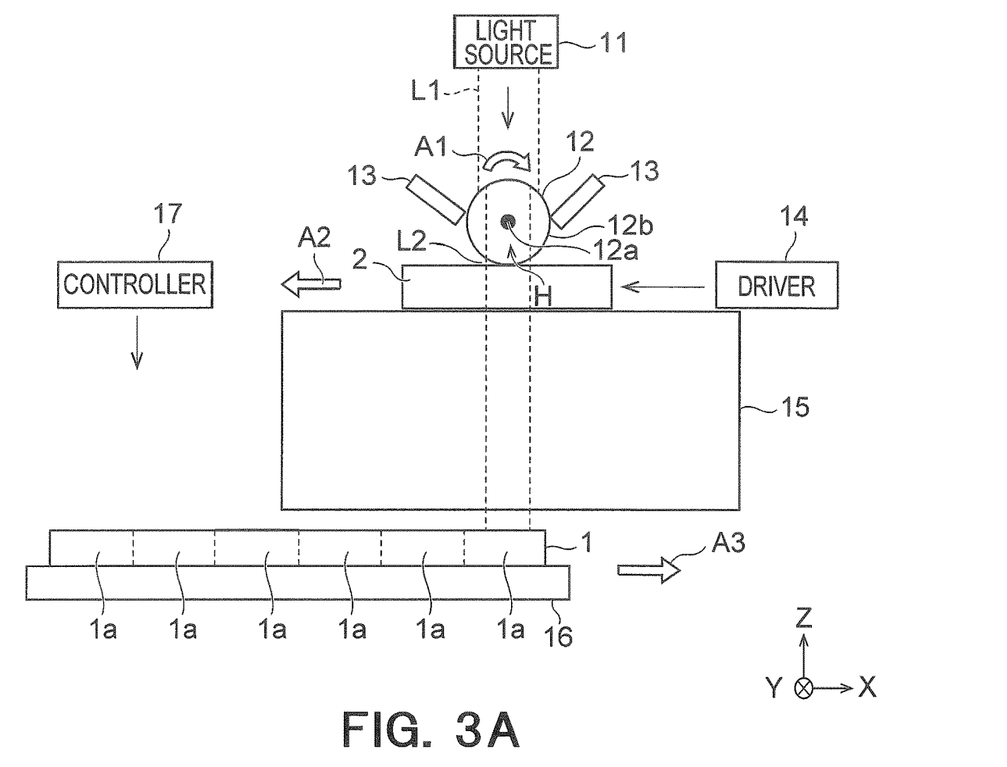
Figure 3B:
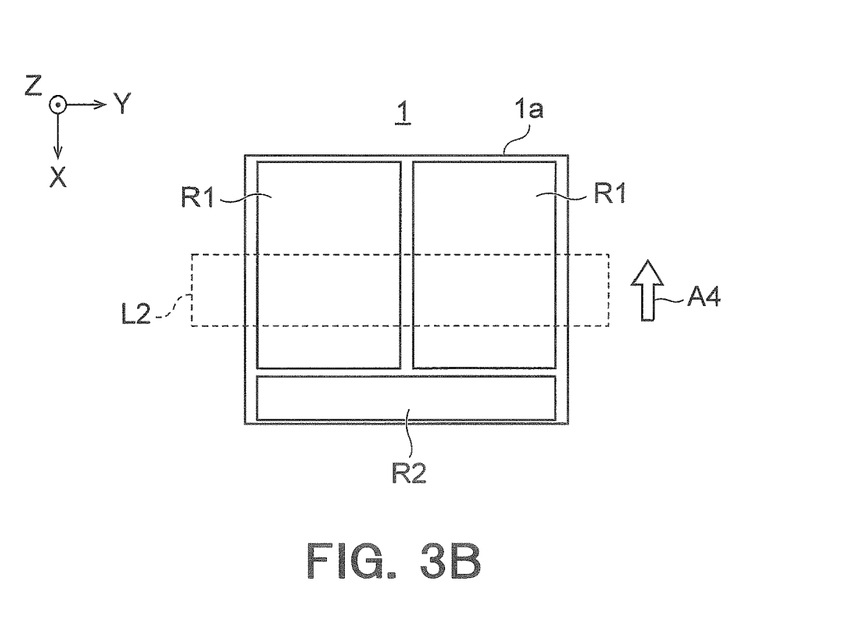
Figure 4A:
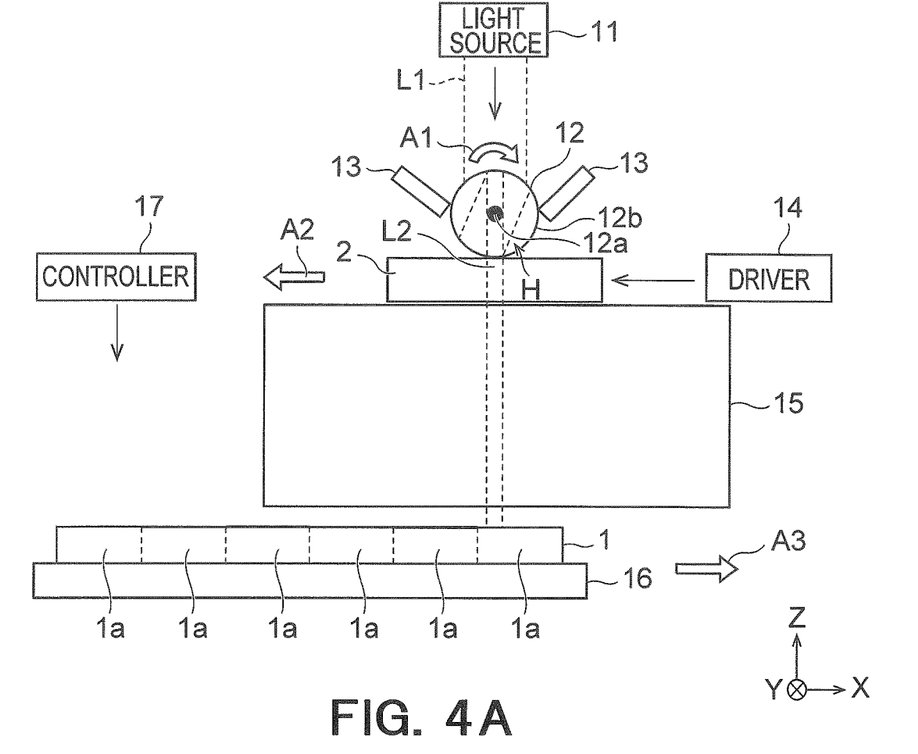

FIG. 2A, FIG. 3A and FIG. 4A illustrate the section of the semiconductor manufacturing apparatus similarly to FIG. 1A, and in more detail, illustrate three stages of exposing the wafer 1. The exposure of the present embodiment advances in order of the stage of FIG. 2A, the stage of FIG. 3A and the stage of FIG. 4A. In addition, FIG. 2B, FIG. 3B and FIG. 4B respectively illustrate the wafer 1 in the stage of FIG. 2A, the stage of FIG. 3A and the stage of FIG. 4A.

In the stage of FIG. 2A, the peripheral circuit area R2 of the wafer 1 is exposed by the light L2 (see FIG. 2B). The slit H illustrated in FIG. 2A is tilted to left compared to the slit H illustrated in FIG. 1A. As a result, the width of the light L2 illustrated in FIG. 2A is narrower than the width of the light L2 illustrated in FIG. 1A. In this way, the semiconductor manufacturing apparatus of the present embodiment scans the peripheral circuit area R2 by the narrow light L2.

In the stage of FIG. 3A, a center portion of the memory cell array areas R1 of the wafer 1 is exposed by the light L2 (see FIG. 3B). The slit H illustrated in FIG. 3A is returned to a same state as the slit H illustrated in FIG. 1A. As a result, the width of the light L2 illustrated in FIG. 3A is wide. In this way, the semiconductor manufacturing apparatus of the present embodiment scans the center portion of the memory cell array areas R1 by the thick light L2. The controller 17 may move the position of the reticle 2 in FIG. 3B from the position of the reticle 2 in FIG. 2A.

Figure 4B:
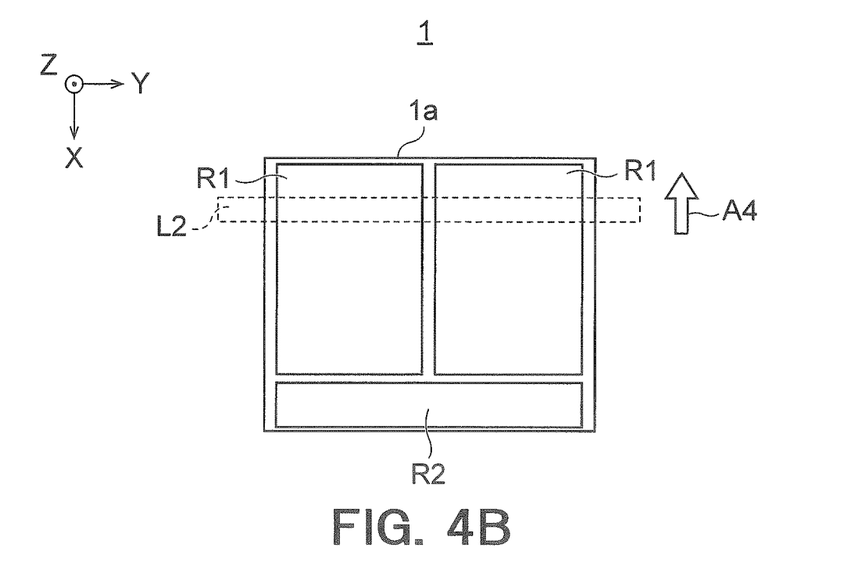

In the stage of FIG. 4A, an end portion of the memory cell array areas R1 of the wafer 1 is exposed by the light L2 (see FIG. 4B). The slit H illustrated in FIG. 4A is tilted to right compared to the slit H illustrated in FIG. 1A. As a result, the width of the light L2 illustrated in FIG. 4A is narrower than the width of the light L2 illustrated in FIG. 1A. In this way, the semiconductor manufacturing apparatus of the present embodiment scans the end portion of the memory cell array areas R1 by the narrow light L2. The controller 17 may move the position of the reticle 2 in FIG. 4B from the position of the reticle 2 in FIG. 3A.

FIGS. 5A to 5D are sectional views for describing a mechanism of the operation of the semiconductor manufacturing apparatus of the first embodiment.

In FIGS. 5A to 5D, in order to easily understandably describe the mechanism of the operation of the semiconductor manufacturing apparatus of the present embodiment, the masking device 12 including the shaft 12a, the rotary blade 12b and the slit H is replaced with a masking device 12' including a shaft 12a', a rotary blade 12b' and a slit H'. A sign I1 denotes the light made incident on the masking device 12', and a sign I2 denotes the light which has passed through the masking device 12'. An origin of xy coordinates illustrated in FIG. 5A to FIG. 5D is positioned on the shaft 12a'.

Figure 5A:
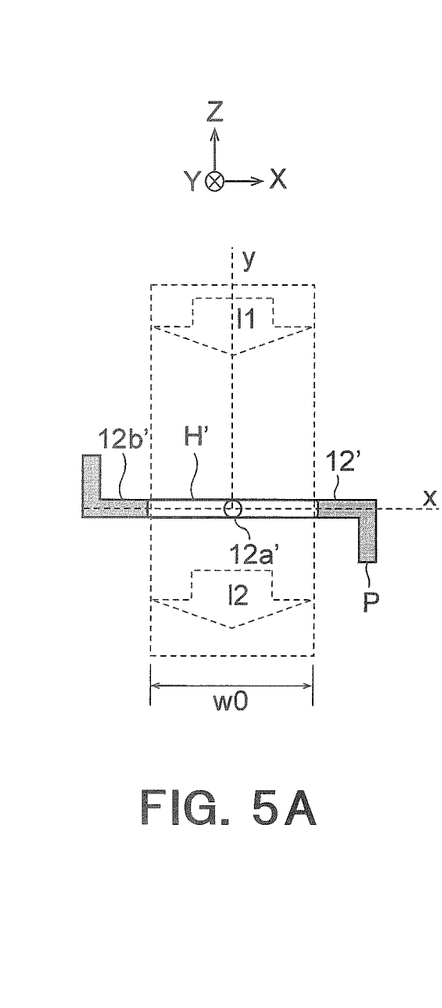
FIGS. 5A to 5D are sectional views for describing a mechanism of the operation of the semiconductor manufacturing apparatus of the first embodiment.

The rotary blade 12b' has a roughly planar shape, and FIG. 5A illustrates the XZ section of the plate. The rotary blade 12b' further includes projected sections P at both ends of the plate. In FIG. 5A, the rotary blade 12b' is parallel to an x axis.

In FIG. 5A, all the light I1 made incident on the masking device 12' passes through the slit H' provided on the rotary blade 12b' further. A sign w0 denotes the width of the light L2 which has passed through the masking device 12'.

Figure 5B:
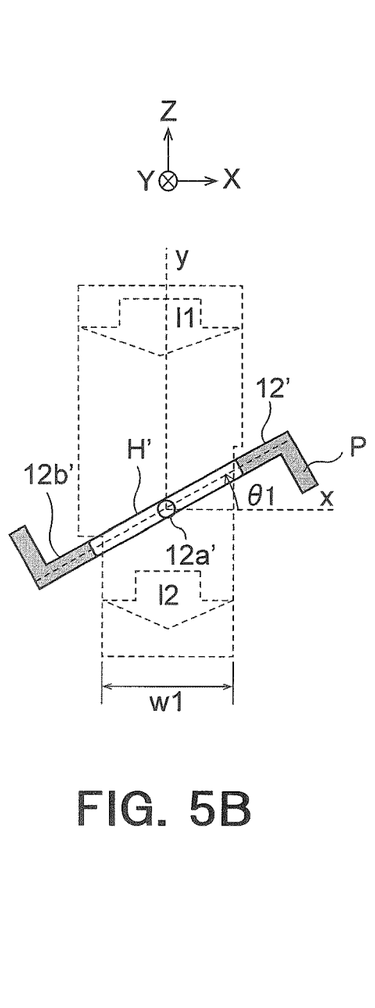
Figure 5C:
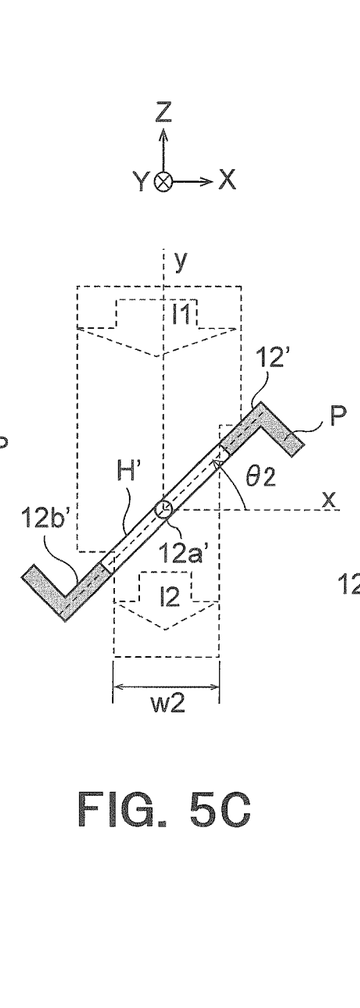
Figure 5D:
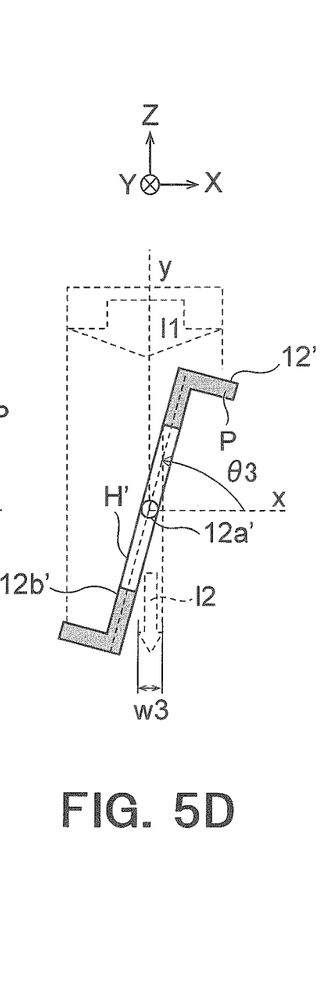

FIG. 5B, FIG. 5C and FIG. 5D illustrate a situation where the rotary blade 12b' is gradually rotated. Signs θ1, θ2 and θ3 respectively denote an angle to the x axis of the rotary blade 12b' in FIG. 5B, FIG. 5C and FIG. 5D. In addition, signs w1, w2 and w3 respectively denote the width of the light I2 in FIG. 5B, FIG. 5C and FIG. 5D. It is recognized that, when the angle of the rotary blade 12b' increases as θ1, θ2 and θ3, the width of the light I2 decreases as w1, w2 and w3. When the result is applied to the masking device 12 in FIG. 1A, it is understood that the width of the light L2 can be changed by the rotation of the rotary blade 12b.

When the angle of the rotary blade 12b' is increased to θ3 in FIG. 5D, the light I1 is made incident also on the projected sections P. If the rotary blade 12b' is not provided with the projected sections P, the light I1 is made incident on the wafer 1 without passing through the slit H' in the state of FIG. 5D. However, when the rotary blade 12b' is provided with the projected sections P, incidence of the light I1 on the wafer 1 can be suppressed. The masking members 13 in FIG. 1A have a function similar to the projected sections P.

Figure 6:
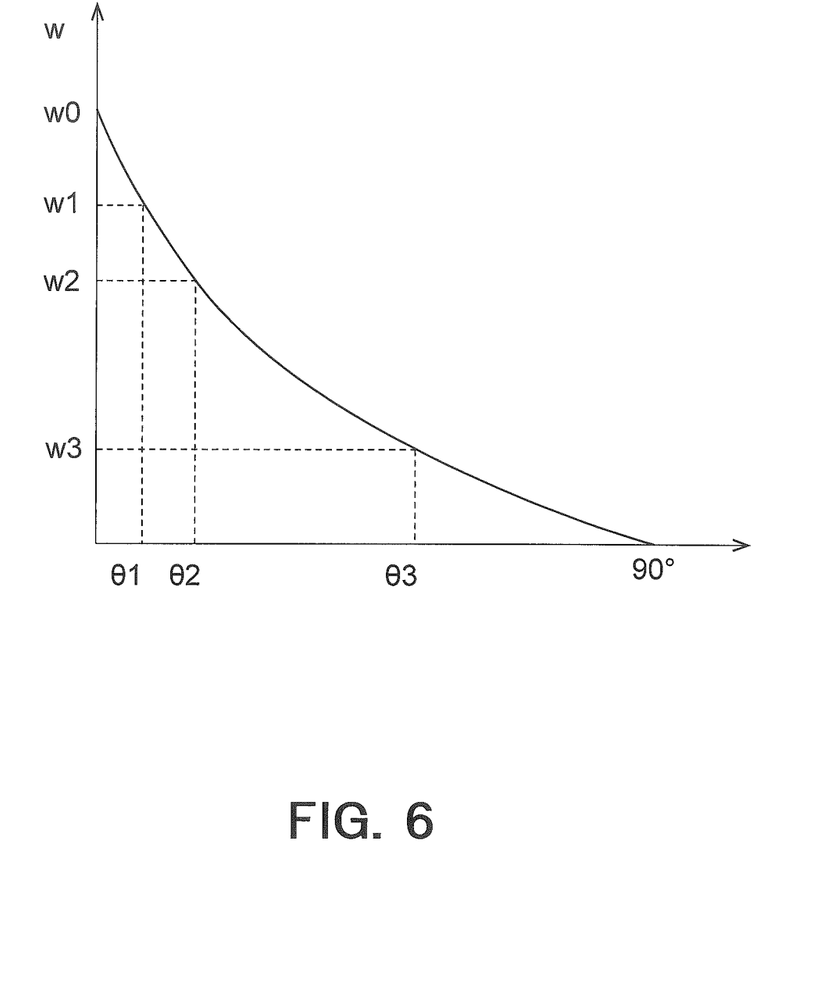
FIG. 6 is a graph for describing the mechanism of the operation of the semiconductor manufacturing apparatus of the first embodiment.

FIG. 6 is a graph for describing the mechanism of the operation of the semiconductor manufacturing apparatus of the first embodiment.

A horizontal axis in FIG. 6 indicates the angle to the x axis of the rotary blade 12b', and a vertical axis in FIG. 6 indicates the width (w) of the light I2. FIG. 6 illustrates that, when the angle of the rotary blade 12b' increases as θ1, θ2 and θ3, the width of the light I2 decreases as w1, w2 and w3.

In FIG. 6, within a range of 0 degree to 90 degrees, the angle of the rotary blade 12b' and the width of the light I2 are in one-to-one correspondence. Specifically, the width of the light I2 is a monotone decreasing function of the angle of the rotary blade 12b'. Accordingly, when a relation between the angle and the width is prepared in a form of a table, by controlling the angle of the rotary blade 12b' to a predetermined angle, the width of the light I2 can be controlled to a predetermined width.

It is similar for the semiconductor manufacturing apparatus in FIG. 1A. Therefore, the semiconductor manufacturing apparatus of the present embodiment preserves the table indicating the relation between the angle of the rotary blade 12b and the width of the light L2 inside the controller 17 beforehand. Therefore, the controller 17 can control the width of the light L2 to the predetermined width by controlling the angle of the rotary blade 12b to the predetermined angle when exposing the wafer 1. Instead of the table described above, a function indicating the relation between the angle of the rotary blade 12b and the width of the light L2 may be preserved inside the controller 17 beforehand.

Figure 7A:
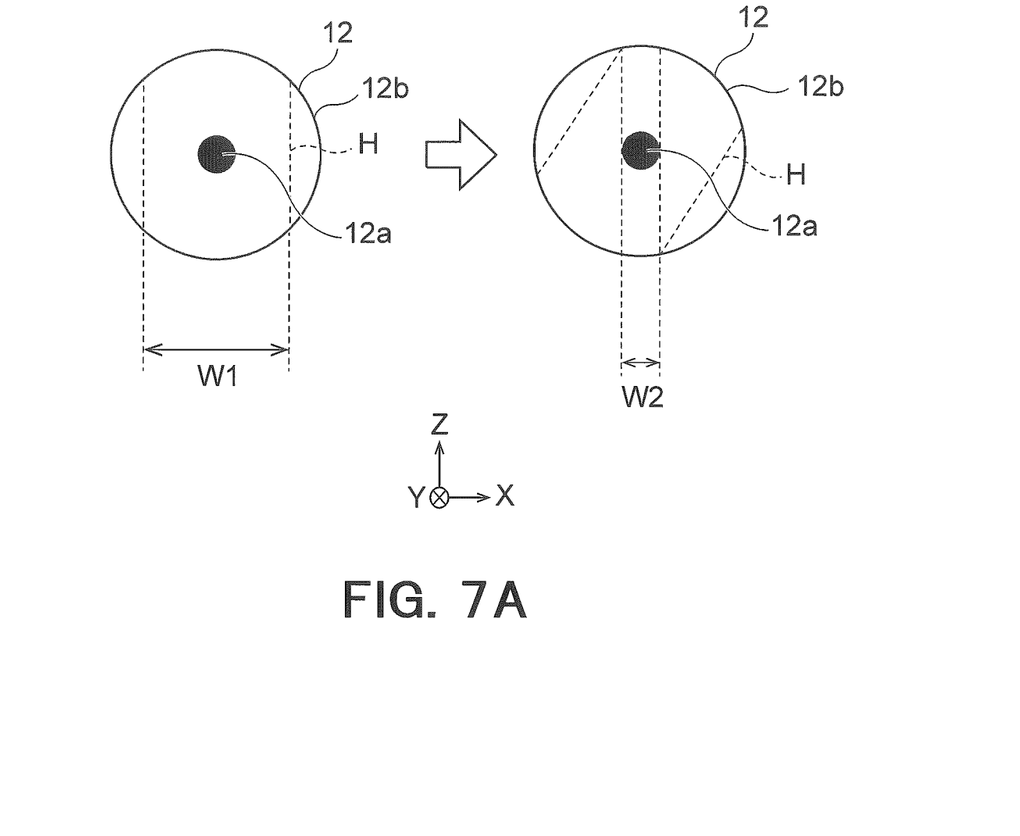
FIGS. 7A and 7B are sectional views for comparing the semiconductor manufacturing apparatus of the first embodiment and a semiconductor manufacturing apparatus of the comparative example.
Figure 7B:
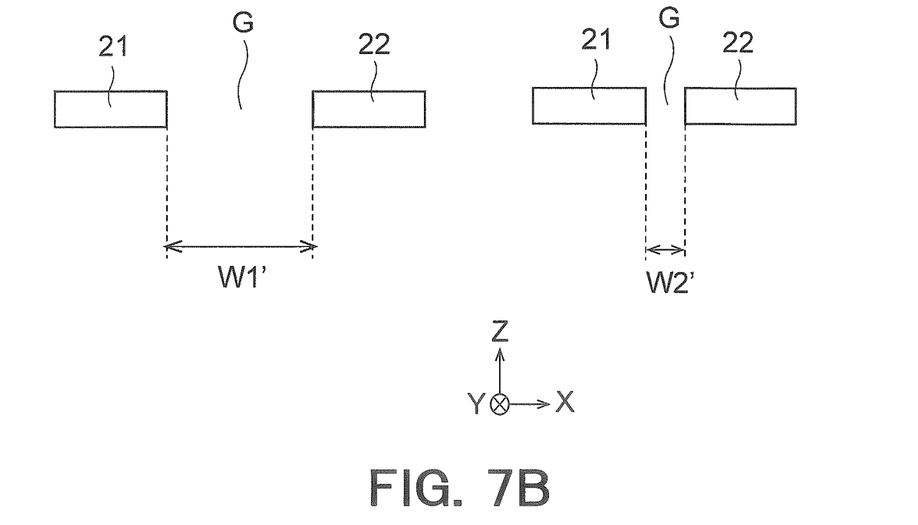

FIGS. 7A and 7B are sectional views for comparing the semiconductor manufacturing apparatus of the first embodiment and a semiconductor manufacturing apparatus of the comparative example.

FIG. 7A illustrates the masking device 12 of the semiconductor manufacturing apparatus of the present embodiment. Specifically, the situation of rotating the rotary blade 12*b* is illustrated. In the present embodiment, by rotating the rotary blade 12*b*, the width of the light passing through the slit H can be changed from W1 to W2, for example.

FIG. 7B illustrates two masking blades 21 and 22 of the semiconductor manufacturing apparatus of the comparative example. Specifically, the situation of changing a clearance G between the masking blades 21 and 22 is illustrated. In the present comparative example, by moving the two masking blades 21 and 22, the width of the light passing through the clearance G can be changed from W1' to W2', for example.

In the comparative example, it is needed to move the two members (masking blades 21 and 22) in order to change the width of the light, and when the accuracy of synchronizing the operations of the members is poor, the process accuracy of the resist film becomes poor. On the other hand, the width of the light of the present embodiment can be changed by rotating the rotary blade 12*b*. Therefore, the width of the light can be changed without synchronizing the operations of the plurality of members, and the exposure accuracy can be easily improved.

The difference becomes clearer when components to synchronize the operations increase. For example, in the case of changing the width of the light and also moving the wafer 1 and the reticle 2, in the comparative example, it is needed to synchronize the operations of four components that are the wafer 1, the reticle 2, the masking blade 21 and the masking blade 22. On the other hand, in the present embodiment, just the operations of three components that are the wafer 1, the reticle 2 and the rotary blade 12*b* are synchronized. In addition, since the rotation of the rotary blade 12*b* can be more highly accurately controlled when the stepping motor is adopted as the motor 12*d*, the exposure accuracy can be improved compared to the comparative example.

Figure 8A:
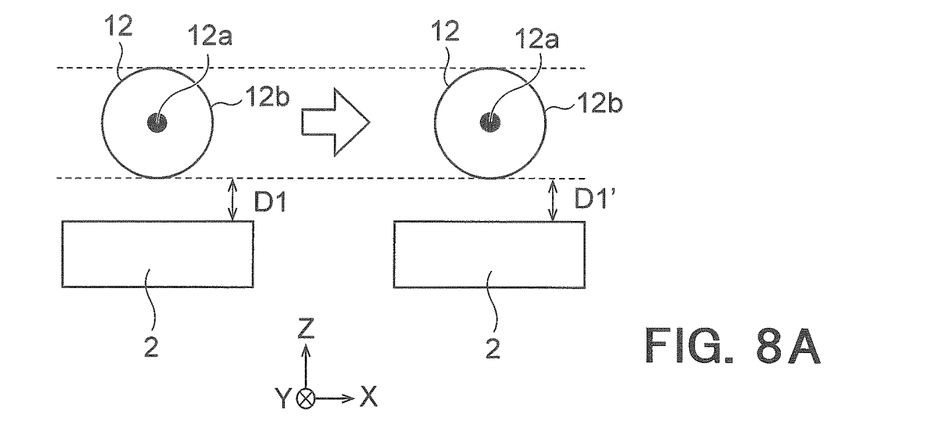
FIGS. 8A to 8C are sectional views for describing the structure of the semiconductor manufacturing apparatus of the first embodiment.
Figure 8B:
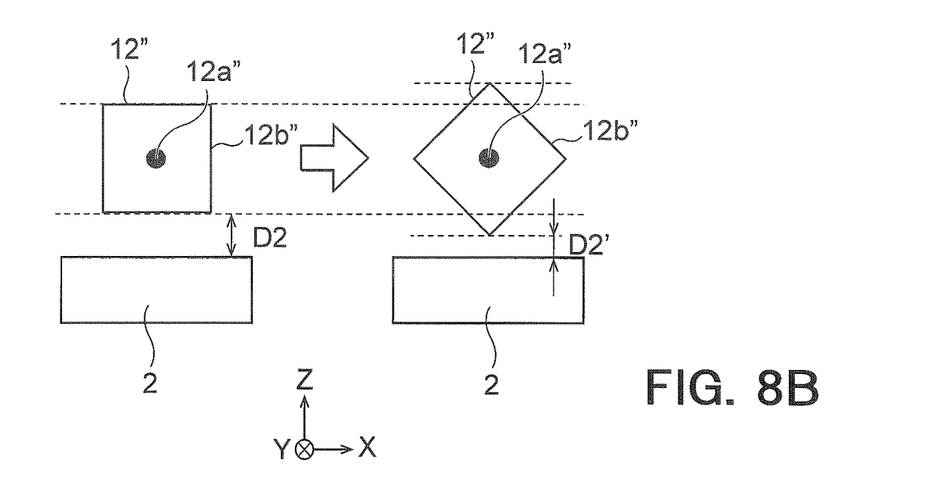
Figure 8C:
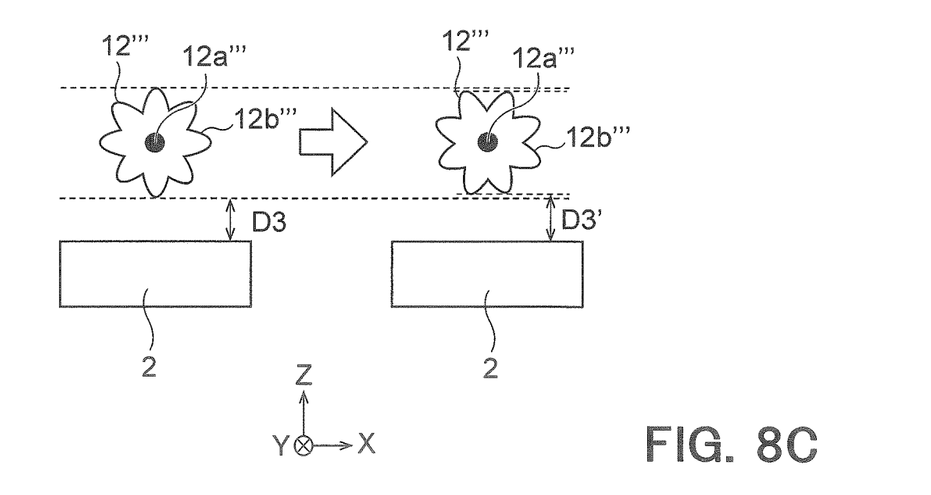

FIGS. 8A to 8C are sectional views for describing the structure of the semiconductor manufacturing apparatus of the first embodiment. FIG. 8A, FIG. 8B and FIG. 8C illustrate three examples of the masking device of the present embodiment.

FIG. 8A illustrates the masking device 12 including the shaft 12*a* and the rotary blade 12*b*. The rotary blade 12*b* has a circular XZ sectional shape similarly to the case of FIG. 1A. A sign D1 denotes a distance between the rotary blade 12*b* and the reticle 2 before rotating the rotary blade 12*b*, and a sign D1' denotes a distance between the rotary blade 12*b* and the reticle 2 after rotating the rotary blade 12*b*. In FIG. 8A, the distance D1' is the same as the distance D1.

FIG. 8B illustrates a masking device 12" including a shaft 12*a*" and a rotary blade 12*b*". The rotary blade 12*b*" has a quadrangular XZ sectional shape. A sign D2 denotes a distance between the rotary blade 12*b*" and the reticle 2 before rotating the rotary blade 12*b*", and a sign D2' denotes a distance between the rotary blade 12*b*" and the reticle 2 after rotating the rotary blade 12*b*". In FIG. 8B, the distance D2' is reduced from the distance D2.

FIG. 8C illustrates a masking device 12'" including a shaft 12*a*'" and a rotary blade 12*b*"". The rotary blade 12*b*"" has a gear-shaped XZ sectional shape. A sign D3 denotes a distance between the rotary blade 12*b*'" and the reticle 2 before rotating the rotary blade 12*b*'", and a sign D3' denotes a distance between the rotary blade 12*b*'" and the reticle 2 after rotating the rotary blade 12*b*'". In FIG. 8C, the distance D3' is increased from the distance D3.

In the present embodiment, it is desirable that the distance between the rotary blade 12*b* and the reticle 2 does not change as illustrated in FIG. 8A. It is because there is a risk that the change in the distance between the rotary blade 12*b* and the reticle 2 adversely affects the exposure. Therefore, in the present embodiment, the XZ sectional shape of the rotary blade 12*b* is set to be circular.

As described above, the semiconductor manufacturing apparatus of the present embodiment includes the masking device 12 including the rotary blade 12*b* provided with the slit H, and the width of the light passing through the slit H is changed by rotating the rotary blade 12*b* while scanning the wafer 1. Therefore, according to the present embodiment, by changing the width of the light without synchronizing the operations of the plurality of members, the exposure accuracy can be easily improved. In addition, according to the present embodiment, since the width of the light can be easily changed in synchronism with movement of the wafer 1 and the reticle 2, the width of the light can be changed while scanning the wafer 1, while improving the exposure accuracy. In this way, according to the present embodiment, the exposure accuracy of the wafer 1 can be improved.

While certain embodiments have been described, these embodiments have been presented by way of example only, and are not intended to limit the scope of the inventions. Indeed, the novel apparatuses and methods described herein may be embodied in a variety of other forms; furthermore, various omissions, substitutions and changes in the form of the apparatuses and methods described herein may be made without departing from the spirit of the inventions. The accompanying claims and their equivalents are intended to cover such forms or modifications as would fall within the scope and spirit of the inventions.

The invention claimed is:

1. A semiconductor manufacturing apparatus comprising:
   a stage on which a substrate is to be installed;
   a light source configured to generate light;
   a shaper including a rotating portion provided with an opening configured to shape the light from the light source, the shaper being configured to irradiate a photomask with the light which has passed through the opening;
   a member arranged in a vicinity of the rotating portion and configured to shield the light from the light source; and
   a controller configured to change a width of the light passing through the opening by rotating the rotating portion while scanning the substrate by the light which has passed through the photomask,
   wherein
   the opening has a quadrangular sectional shape on a section vertical to a direction in which the opening penetrates the rotating portion, and
   the controller rotates the opening by rotating the rotating portion to change an opening area of the opening against the light incident on the rotating portion, thereby changing the width of the light passing through the opening.

2. The apparatus of claim 1, wherein
   the shaper further includes a motor configured to rotate the rotating portion, and
   the controller rotates the rotating portion by controlling the motor.

3. The apparatus of claim 1, wherein the rotating portion has a circular sectional shape on a section vertical to a rotary axis of the rotating portion.

4. The apparatus of claim 1, wherein the rotating portion is formed of a material which shields the light from the light source.

5. The apparatus of claim 1, wherein the rotating portion is formed of a material which shields the light having a wavelength of 13.5 nm to 456 nm.

6. The apparatus of claim 1, further comprising a driver configured to move the photomask while the substrate is scanned by the light which has passed through the photomask.

7. The apparatus of claim 1, wherein the stage moves the substrate such that the substrate is scanned by the light which has passed through the photomask.

8. The apparatus of claim 1, wherein the controller rotates the rotating portion, based on information regarding a pattern that is to be formed on the substrate.

9. A method of manufacturing a semiconductor device, comprising:
    installing a substrate on a stage;
    generating light from a light source;
    shaping the light from the light source by an opening provided on a rotating portion of a shaper, and irradiating a photomask with the light which has passed through the opening; and
    changing a width of the light passing through the opening by rotating the rotating portion while scanning the substrate by the light which has passed through the photomask,
    wherein
    a member configured to shield the light from the light source is arranged in a vicinity of the rotating portion,
    the opening has a quadrangular sectional shape on a section vertical to a direction in which the opening penetrates the rotating portion, and
    the opening is rotated by rotating the rotating portion to change an opening area of the opening against the light incident on the rotating portion, thereby changing the width of the light passing through the opening.

10. The method of claim 9, wherein the rotating onion is rotated by controlling a motor of the shaper.

11. The method of claim 9, wherein the rotating portion has a circular sectional shape on a section vertical to a rotary axis of the rotating portion.

12. The method of claim 9, wherein the rotating portion is formed of a material which shields the light from the light source.

13. The method of claim 9, wherein the rotating portion is formed of a material which shields the light having a wavelength of 13.5 nm to 456 nm.

14. The method of claim 9, further comprising moving photomask while the substrate is scanned by the light which has passed through the photomask.

15. The method of claim 9, wherein the stage moves the substrate such that the substrate is scanned by the light which has passed through the photomask.

16. The method of claim 9, wherein the rotating portion is rotated, based on information regarding a pattern that is to be formed on the substrate.

* * * * *